(12) United States Patent
Han

(10) Patent No.: US 7,187,196 B2
(45) Date of Patent: Mar. 6, 2007

(54) LOW RISE/FALL SKEWED INPUT BUFFER COMPENSATING PROCESS VARIATION

(75) Inventor: Jonghee Han, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/716,079

(22) Filed: Nov. 18, 2003

(65) Prior Publication Data

US 2005/0104618 A1    May 19, 2005

(51) Int. Cl.
   *H03K 17/16* (2006.01)
   *H03K 19/017* (2006.01)
(52) U.S. Cl. .......................... 326/27; 326/87; 327/112
(58) Field of Classification Search ................ 326/27, 326/83, 86, 87; 327/108, 112
   See application file for complete search history.

(56) References Cited

U.S. PATENT DOCUMENTS 5,847,581 A * 12/1998 Allen .......................... 326/81
6,492,836 B2 * 12/2002 Kiehl .......................... 326/83

* cited by examiner

*Primary Examiner*—Daniel D. Chang
(74) *Attorney, Agent, or Firm*—Patterson & Sheridan, L.L.P.

(57) ABSTRACT

Buffer circuits and techniques that reduce skew between rising and falling times of output data as process conditions vary are provided. One or more process-dependent current sources may be utilized to compensate for process variations by supplementing the current drive of transistors used to precharge (PMOS) or discharge (NMOS) an output node of a secondary (e.g., inverter) stage of the buffer circuit.

26 Claims, 5 Drawing Sheets

LOW RISE/FALL SKEWED INPUT BUFFER COMPENSATING PROCESS VARIATION

BACKGROUND OF THE INVENTION

1. Field of the Invention

The present invention generally relates to integrated circuit devices and, more particularly to buffer circuits utilized in integrated circuit devices.

2. Description of the Related Art

Integrated circuit devices (ICs) utilize input buffers for a variety of purposes, such as receiving input signals supplied from an external device and supplying a "buffered version" of the input signals to some other portion of the IC for processing. As illustrated in FIG. 1, a conventional input buffer 100 typically utilizes two stages: a differential amplifier stage 110 and a simple inverter stage 120.

The differential amplifier stage 110 typically receives an input signal ($V_{IN}$) applied to one input and a reference voltage ($V_{REF}$) applied to another input. As illustrated, the differential amplifier stage 110 includes an arrangement of PMOS transistors (MPA and MPB) and NMOS transistors (MNA, MNB, and MNE). The differential amplifier stage 110 generates a single ended output $V_{DA}$ that basically represents an amplification of the difference between $V_{REF}$ and $V_{IN}$ when the circuit is enabled (via MNE). In other words, if the voltage level of $V_{REF}$ is greater than $V_{IN}$, more current will flow through MNA than MNB and the potential at output node B will be high. On the other hand, if the voltage level of $V_{REF}$ is less than $V_{IN}$, more current will flow through MNB than MNA and the potential at output node B will be low.

The inverter stage 120 receives the single ended output signal $V_{DA}$ generated on output node B as an input and generates a corresponding output signal $V_{OUT}$. As $V_{DA}$ transitions high, MN1 is turned on and MP1 is turned off. Therefore, the output node NO is pulled low as current IN1 flows through MN1, thus resulting in a logic high for $V_{OUT}$ at the output of output inverter 122. As $V_{DA}$ transitions low, MN1 is turned off and MP1 is turned on. Therefore, the output node NO is pulled high as current IN1 flows through MN1, thus resulting in a logic low for $V_{OUT}$ at the output of output inverter 122.

Thus, the main purpose of the inverter stage 120 is to transfer $V_{DA}$ to the next stage, preferably with little difference (or "skew") between rising and falling edges. By tuning the size of the transistors used in the inverter stage 120 to match the rate at which the output node is discharged or precharged (as current IN1 and IP1 flows, respectively), the skew between rising and falling edges can be minimized. However, current flow through NMOS and PMOS transistors is highly sensitive to process variations (e.g., variations in supply voltages or operating temperature).

As illustrated in FIG. 2A, process variations resulting in stronger NMOS current drive (relative to PMOS current drive) may result in node NO being pulled down through MN1 faster than it is pulled up through MP1 (resulting, e.g., in a faster discharge rate). Similarly, as illustrated in FIG. 2B, process variations resulting in weaker NMOS current drive may result in node NO being pulled down through MN1 slower than it is pulled up through MP1 (resulting, e.g., in a faster precharge rate). Either case results in a skew between rise and fall times which must be accounted for in the specified setup/hold time of the input buffer 100. As device frequencies increase, it is essential to minimize such skew.

Accordingly, there is a need for an improved buffer circuit that is less sensitive to process variations than conventional buffer circuits.

SUMMARY OF THE INVENTION

The present invention generally provides an improved buffer circuit that minimizes skew between rising and falling edges of data output by the buffer circuit as process conditions vary.

One embodiment provides a method of minimizing skew between rising and falling data at an output node of a buffer circuit. The method generally includes generating an intermediate voltage signal from an input voltage signal applied to an input node of the buffer circuit, generating an output voltage signal at the output node based on the intermediate voltage signal, and coupling at least one compensating current source to the output node to compensate for changes in at least one of a rate at which the output node is precharged and a rate at which the output node is discharged.

Another embodiment provides a buffer circuit generally including a first stage for generating an intermediate voltage signal from an input voltage signal applied to an input node of the first stage, a second stage to receive the intermediate voltage signal and generate, on an output node of the second stage, an output voltage based on the intermediate voltage signal, and at least a first compensating current source coupled to the output node to compensate for changes in at least one of a rate at which the output node is precharged and a rate at which the output node is discharged.

Another embodiment provides a buffer circuit generally including a differential amplifier stage for generating an intermediate voltage signal indicative of the voltage difference between a reference voltage signal and an input voltage signal applied to an input node of the differential amplifier stage, an inverter stage for generating, on an output node, an output voltage signal based on the intermediate voltage signal, wherein the inverter stage comprises at least one PMOS transistor and at least one NMOS transistor, and at least a first current mirror circuit having a first branch and a second branch coupled to the output node, wherein current flowing through the first branch is dependent on changes in at least one of NMOS or PMOS current drive and current flowing through the second branch mirrors the current flowing through the first branch.

Another embodiment provides a memory device generally including an input to receive an external clock signal and a buffer circuit for generating an internal clock signal to be provided to one or more components of the memory device. The buffer circuit generally includes a first stage for generating an intermediate voltage signal indicative of a difference between a reference voltage signal and the clock signal, a second stage for generating an output voltage signal on an output node based on the intermediate voltage signal, an inverter for generating the internal clock signal based on the output voltage signal, and at least one compensating current source coupled to the output node to compensate for changes in at least one of a rate at which the output node is precharged and a rate at which the output node is discharged.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

The present invention generally provides an improved buffer circuit that minimizes skew between rising and falling edges of output data as process conditions vary. As previously described, variations in process conditions may result in stronger or weaker relative current drive between NMOS and PMOS transistors. For some embodiments, one or more process-dependent current sources may be utilized to compensate for process variations by supplementing the current drive of transistors used to precharge (PMOS) or discharge (NMOS) an output node of a secondary (e.g., inverter) stage of the buffer circuit. As a result, rise and fall times of data output by the secondary stage may be more closely matched, thus minimizing skew.

For example, as NMOS transistor current drive gets stronger, current from a compensating current source may supplement (relatively weaker) PMOS transistor current drive. As NMOS current drive gets weaker, current flow through the one or more compensating transistors may decrease accordingly. As used herein, the terms stronger and weaker current drives are relative terms, referring to NMOS current drive relative to PMOS current drive or vice-versa. Further, the term current source generally refers to either a device that sources current to a node or sinks current from the node. One skilled in the art will recognize that buffer circuits described herein may be utilized to advantage in a variety of different integrated circuit devices, including, but not limited to processors and memory, such as dynamic random access memory (DRAM). By minimizing the skew between rising and falling data, setup and hold times may be reduced, allowing devices to operate at increased frequencies.

An Exemplary Integrated Circuit Device

Figure 3:
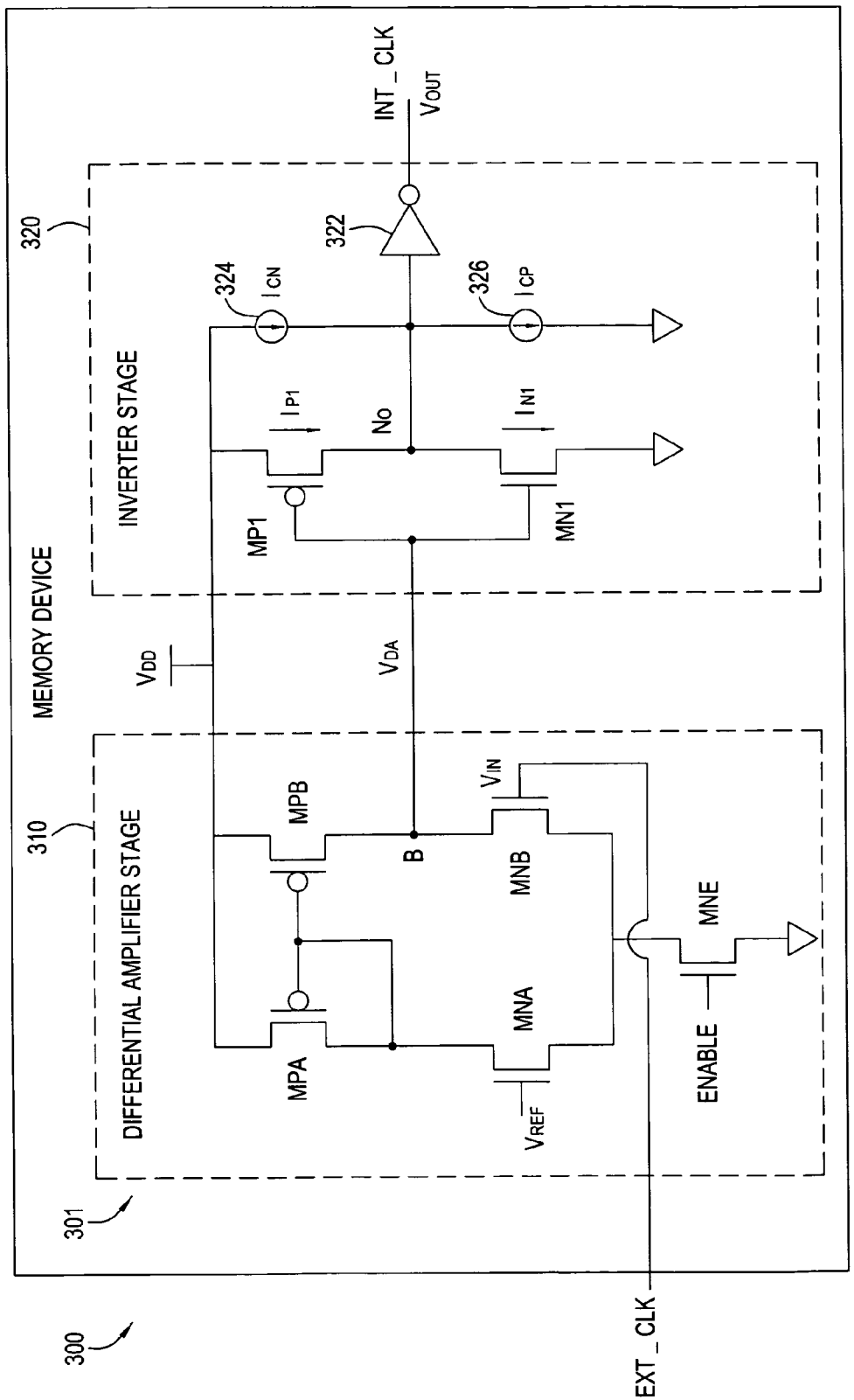
FIG. 3 is a schematic diagram of an exemplary integrated circuit (IC) device utilizing a buffer circuit in accordance with one embodiment of the present invention.

FIG. 3 illustrates an exemplary memory device 300 utilizing a buffer circuit 301 in accordance with one embodiment of the present invention to generate an internal (buffered) clock signal from an external clock signal. As illustrated, the buffer circuit 301 may include a first (e.g., differential amplifier) stage 310 and a second (e.g., inverter) stage 320. As illustrated, one or more compensating current sources (e.g., current source 324 and/or current sink 326) may be coupled to an output node (NO) of the secondary stage 320 to compensate for variations in current drive of NMOS and PMOS transistors (e.g., MN1 and MP1, respectively) which may result from process variations.

Figure 1:
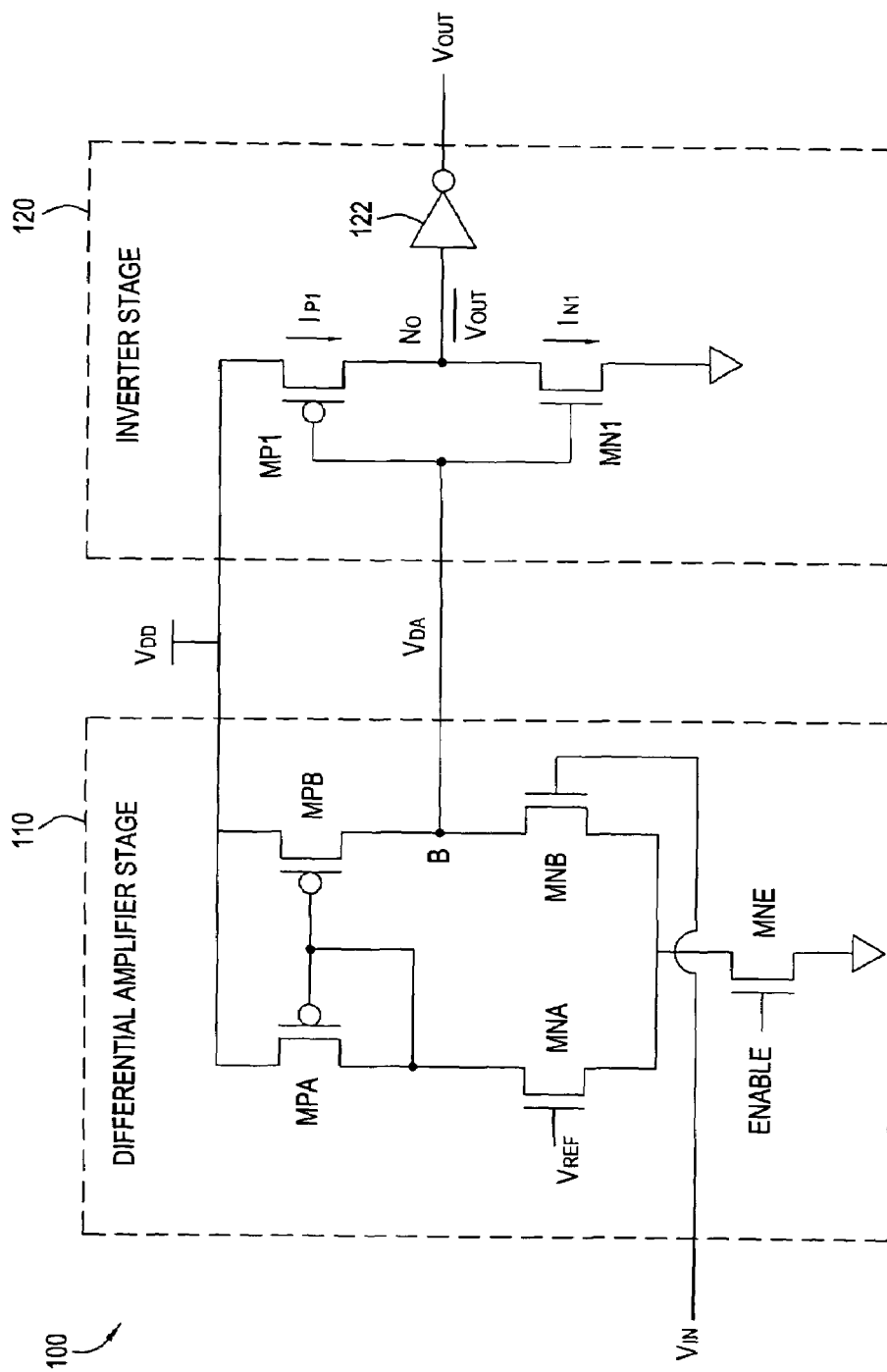
FIG. 1 is a schematic diagram of a conventional buffer circuit.
Figures 2A, 2B:
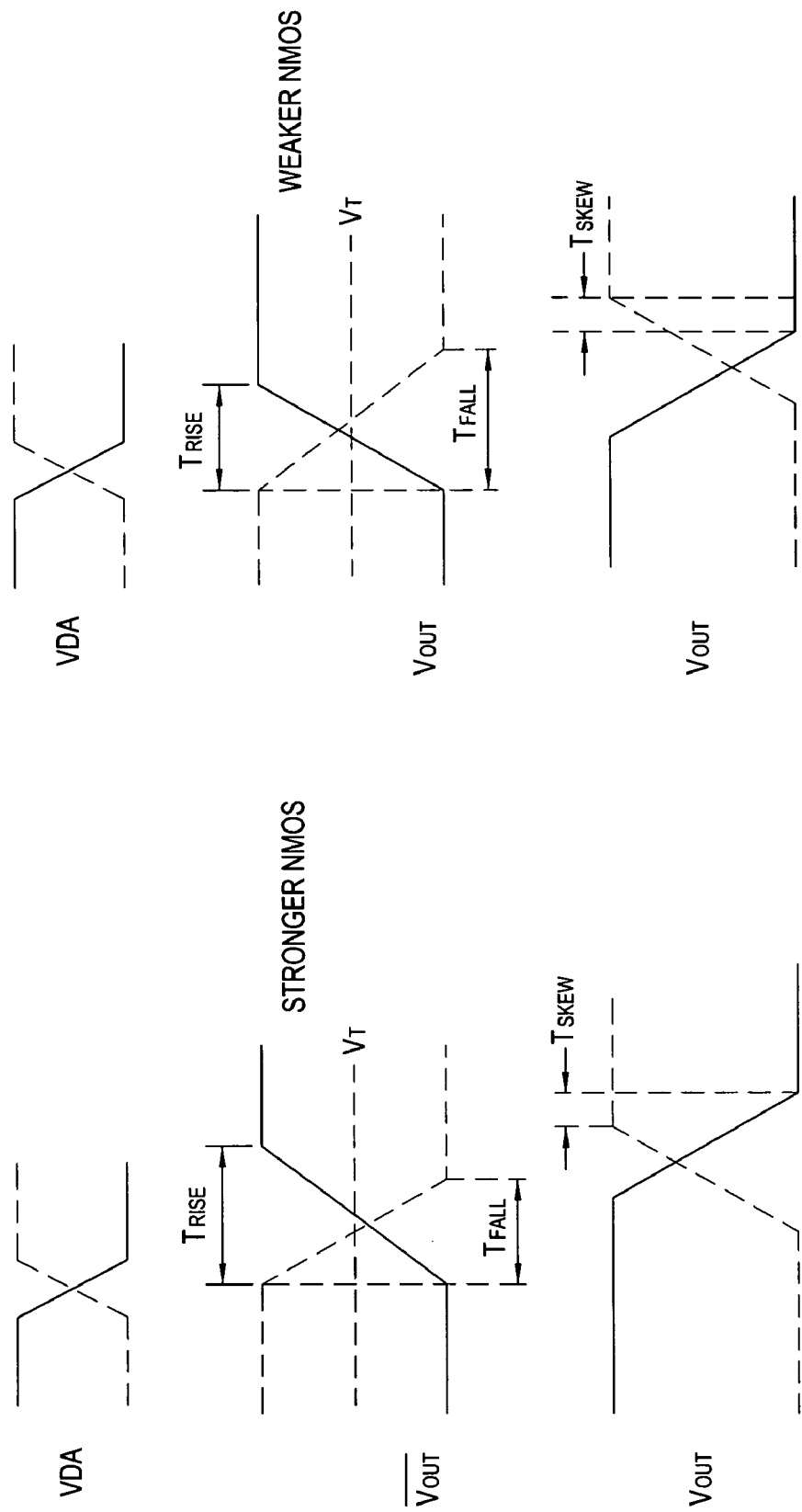
FIGS. 2A and 2B are exemplary timing diagrams corresponding to the buffer circuit of FIG. 1.

As previously described with reference to FIG. 1, the differential input stage 310 typically generates a single ended voltage output signal ($V_{DA}$) indicative of the difference between an input signal ($V_{IN}$) applied to one input and a reference voltage ($V_{REF}$) applied to another input. The main purpose of the secondary stage 320 is to transfer $V_{DA}$ as a generated output signal $V_{OUT}$ to the next stage (e.g., another component of the IC device 300).

As illustrated, the secondary stage 320 receives the single ended output signal $V_{DA}$ and generates $V_{OUT}$. As $V_{DA}$ transitions high, MN1 is turned on and MP1 is turned off. Therefore, the output node NO is pulled low as current IN1 flows through MN1, thus resulting in a logic high for $V_{OUT}$ at the output of output inverter 322. As $V_{DA}$ transitions low, MN1 is turned off and MP1 is turned on, and the output node NO is pulled high as current IN1 flows through MN1, thus resulting in a logic low for $V_{OUT}$ at the output of output inverter 322.

As previously described, the size of the transistors MN1 and MP1 used in the secondary stage 320 may be tuned in an effort to match the rate at which the output node is discharged or precharged (as current IN1 and IP1 flows, respectively). However, the current drive of NMOS and PMOS transistors may be highly sensitive to process variations (e.g., changes in supply voltage or operating temperature). As a result, transistors matched during certain (e.g., expected or nominal) operating parameters may not be matched as those parameters change.

However, either one or both of the current source 324 and current sink 326 may serve to reduce the sensitivity of transistors MN1 and MP1 to process variations by supplementing current sourced by the weaker transistor. As an example, process variations may result in stronger NMOS current drive and a corresponding increase in current IN1 flowing through MN1 (for rising $V_{DA}$). This increase in IN1 may lead to a faster discharge rate of the output node NO. In an effort to reduce skew between rising and falling data, compensating current (ICN) from the current source 324 may supplement (relatively weaker) current IP1 flowing through MP1 (for falling $V_{DA}$), allowing node NO to be precharged faster (e.g., at substantially the same rate as it is discharged).

In other words, the current source 324 may be designed as a process-dependent current source, such that changes in the amount of current (ICN) sourced due to process variations are substantially similar to the changes in current IN1 flowing through MN1. Accordingly, as the NMOS current drive gets weaker (e.g., as operating parameters return to a nominal state), the compensating current ICN may be reduced by a similar amount.

In a similar manner, stronger PMOS current drive may be compensated for by current (ICP) from current sink 326. For example, stronger PMOS current drive may lead to an increase in current IP1 flowing through MP1, leading to a faster precharge rate (for falling $V_{DA}$) of the output node NO. However, compensating current (ICP) through current sink 326 may supplement (relatively weaker) current IN1 flowing through MN1 (for falling $V_{DA}$), allowing node NO to be discharged at a faster rate. For different embodiments, various combinations of one or more PMOS or NMOS compensating current sources may be utilized to reduce skew.

Exemplary Process Dependent Current Sources

Figure 4:
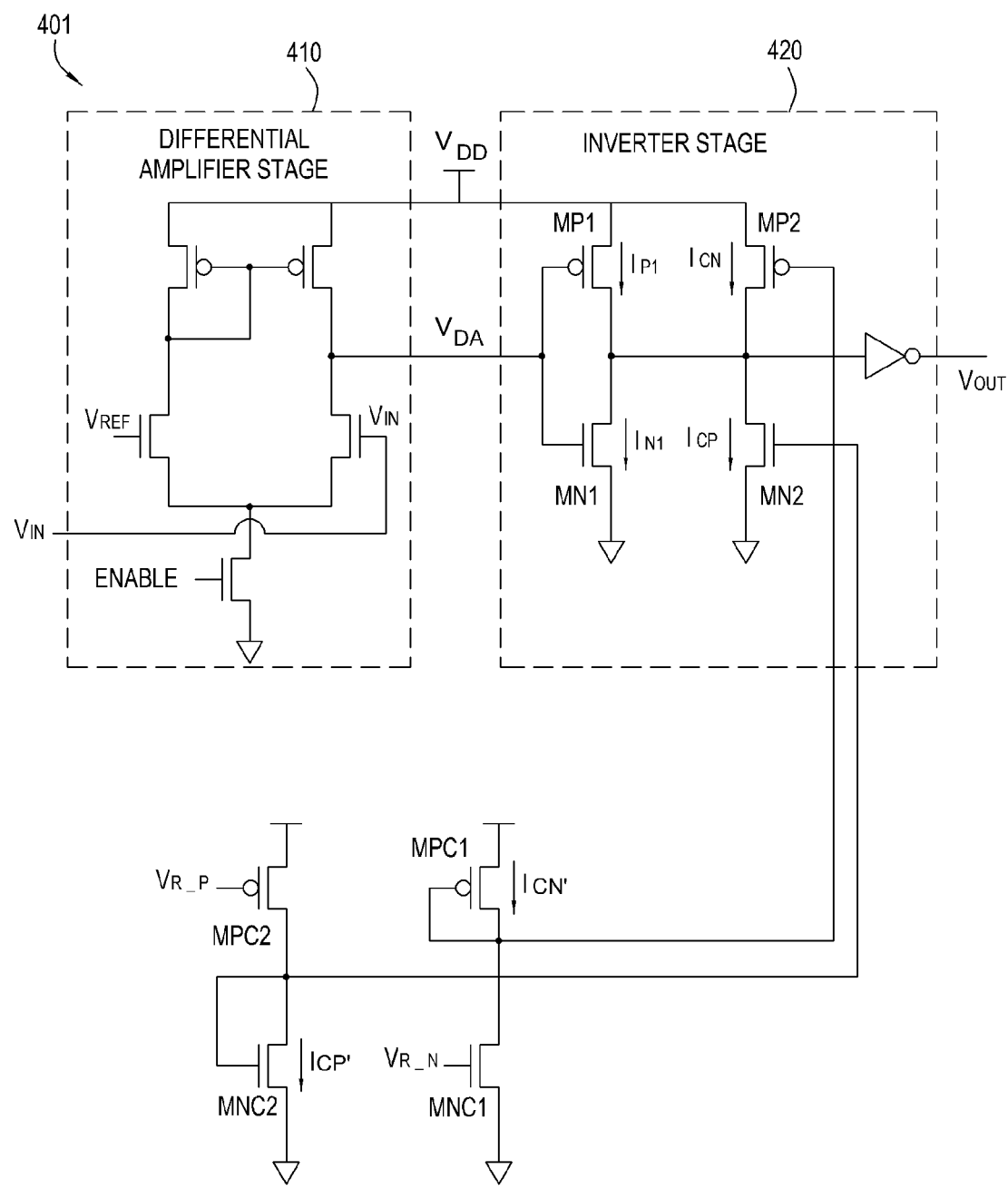
FIG. 4 is another schematic diagram of a buffer circuit in accordance with one embodiment of the present invention.

For some embodiments, process dependent current sources may be formed as part of a current mirror circuit. For example, FIG. 4 illustrates an exemplary buffer circuit 401 utilizing current mirror circuits to generate compensating currents ICN and ICP. A first current (sourcing) mirror circuit has a first branch formed by an NMOS transistor MNC1 and PMOS transistor MPC1, and a second branch formed by another PMOS transistor MP2 and coupled to the output node NO of the second stage 420. A second (sinking) current mirror circuit has a first branch formed by a PMOS transistor MPC2 and NMOS transistor MNC2, and a second branch formed by another PMOS transistor MP2 coupled to the output node NO.

Transistors MP2 and MN1 operate as compensating current sources, with their sourced current, ICN and ICP, respectively, determined by the other transistors in their respective current mirror circuits. For example, the current ICN flowing through MP2 mirrors the current ICN' flowing through MNC1, according to the following equation:

$$I_{CN} = A_1 \times I_{CN}'$$

where $A_1$ is a constant, generally determined by the aspect ratio (ratio of channel width W to length L) of transistors MPC1 and MP2. A bias voltage VR_N may be used to control the current ICN' by varying the gate-source voltage of MNC1, and may be selected according to the amount of current ICN needed to compensate for changes in IN1 due to process variations.

As both are NMOS transistors, current drive of transistor MN1 and compensating transistor MNC1 should vary in a similar manner with process changes. For example, an increase in NMOS current drive should result in an increase in IN1, as well as an increase in ICN'. This increase in ICN' is mirrored by an increase in the current ICN flowing through MP2, thus compensating the (relatively weaker) current IP1 flowing through MP1. Similarly, as NMOS current drive gets weaker, a decrease in ICN' is mirrored by a decrease in ICN, thus preventing overcompensating.

In a similar manner, the current drive of PMOS transistors MP1 and MPC2 should vary in a similar manner with process changes. For example, an increase in PMOS current drive should result in an increase in IP1, as well as an increase in ICP', which is mirrored by an increase in ICP flowing through MN2, thus compensating the (relatively weaker) current IN1 flowing through MN1. Decreases in ICP' are similarly mirrored by decreases in ICP.

Bias voltages VR_N and VR_P used to control the compensating currents by varying the gate-source voltages of MNC1 and MPC2, respectively, may be the same or different. Further, these bias voltages may be supplied by one or more voltage sources that are relatively insensitive to process variations, for example, ensuring the bias voltages are relatively stable over a wide range of operating parameters. Providing relatively stable bias voltages may help ensure that changes in compensating currents are due to changes in NMOS and/or PMOS current drive, rather than changes in bias voltages, which may facilitate compensation.

Figure 5:
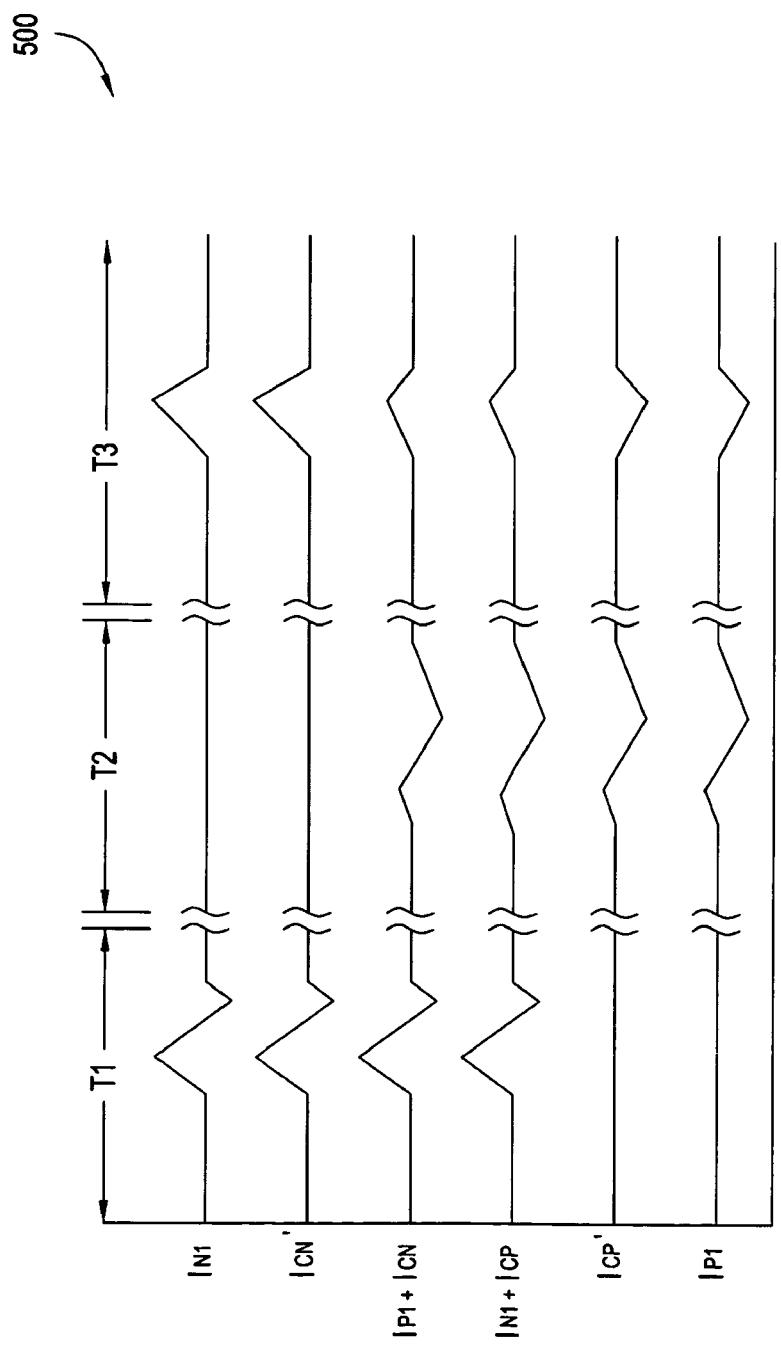
FIG. 5 is a timing diagram of various currents of the buffer circuit of FIG. 4.

FIG. 5 illustrates a timing diagram 500 of various currents shown in FIG. 4 that illustrates how the compensating current sources may serve to match the current used to precharge the output node NO (e.g., IP1+ICN) with the current used to discharge the output node (e.g., IN1+ICP) despite changing NMOS and/or PMOS current drives. During a first period T1, PMOS current drive remains relatively unchanged, while NMOS current drive varies, resulting in changes to IN1 and the discharge current (IN1+ICP). Similar changes occur to ICN', which are mirrored by ICN, thus changing the precharge current (IP1+ICN) accordingly.

During a second period T2, NMOS current drive remains relatively unchanged, while PMOS current drive varies, resulting in changes to IP1 and the precharge current (IP1+ICN). Similar changes occur to ICP', which are mirrored by ICP, thus changing the discharge current (IN1+ICP) accordingly.

During a third period T3, changes occur to both NMOS and PMOS current drive, resulting in corresponding changes to IN1 and IP1. As illustrated, particularly for embodiments where both NMOS and PMOS compensating current sources are used, the precharge and discharge currents may still change together. A decision on whether to use an NMOS compensating current source and/or a PMOS compensating current source may depend on the expected changes in each type of current drive over a specified range of operating parameters.

By providing one or more compensating current sources at the output node of a second stage of a buffer circuit, precharge and discharge rates of the output node may be more evenly matched even in the event of process variations. Each compensating current source may be configured to compensate current supplied by a parallel connected transistor for changes in current drive of a complementary type transistor. By thus matching the precharge and discharge rates of the output node, skew between rising and falling data provided at the output node may be relatively reduced. Further, utilizing compensating current sources may allow the tolerance of matching PMOS and NMOS transistors in the second stage to be relaxed.

While the foregoing is directed to embodiments of the present invention, other and further embodiments of the invention may be devised without departing from the basic scope thereof, and the scope thereof is determined by the claims that follow.

What is claimed is:

1. A method of reducing skew between rising and falling data at an output node of a buffer circuit, comprising:
   generating an intermediate voltage signal from an input voltage signal applied to an input node of the buffer circuit;
   generating an output voltage signal at the output node based on the intermediate voltage signal; and
   coupling a first compensating current source between a supply voltage line and the output node to compensate for changes in NMOS current drive, wherein the first compensating current source comprises a current source transistor for delivering a compensating current to the output node, the current source transistor having a control terminal which is controlled independent of the intermediate voltage signal.

2. The method of claim 1, further comprising coupling a second compensating current source between the output node and ground to compensate for changes in PMOS current drive.

3. The method of claim 1, wherein the compensating current is delivered to the output node through the current source transistor.

4. A method of reducing skew between rising and falling data at an output node of a buffer circuit, comprising:
   generating an intermediate voltage signal from an input voltage signal applied to an input node of the buffer circuit;

generating an output voltage signal at the output node based on the intermediate voltage signal;

coupling at least one compensating current source to the output node to compensate for changes in at least one of a rate at which the output node is precharged and a rate at which the output node is discharged; and controlling the amount of current provided by the compensating current source via a process dependent current source whose current is mirrored to the output node by the compensating current source.

5. The method of claim 4, further comprising controlling the amount of current supplied by the compensating current source via a relatively process independent bias voltage applied to a gate of a transistor of the process dependent current source.

6. A buffer circuit, comprising:

a first stage for generating an intermediate voltage signal from an input voltage signal applied to an input node of the first stage;

a second stage to receive the intermediate voltage signal and generate, on an output node of the second stage, an output voltage based on the intermediate voltage signal; and at least a first compensating current source coupled to the output node to compensate for changes in at least one of a rate at which the output node is precharged and a rate at which the output node is discharged;

wherein the second stage comprises an inverter formed by a PMOS transistor and an NMOS transistor and wherein the first compensating current source comprises a first current source transistor to supplement current flowing into the output node through the PMOS transistor as function of NMOS current drive, the first current source transistor having a control terminal which is controlled independent of the intermediate voltage signal.

7. The buffer of claim 6, wherein changes in current provided by the first current source are proportional to changes in current through the NMOS transistor.

8. The buffer circuit of claim 6, further comprising at least a second current source to supplement current flowing from the output node through the NMOS transistor as function of PMOS current drive.

9. The buffer of claim 6, wherein current flows through the first current source transistor to supplement current flowing into the output node.

10. A buffer circuit, comprising:

a first stage for generating an intermediate voltage signal from an input voltage signal applied to an input node of the first stage;

a second stage to receive the intermediate voltage signal and generate, on an output node of the second stage, an output voltage based on the intermediate voltage signal; and at least a first compensating current source coupled to the output node to compensate for changes in at least one of a rate at which the output node is precharged and a rate at which the output node is discharged;

wherein the second stage comprises an inverter formed by a PMOS transistor and an NMOS transistor and wherein the first compensating current source comprises a first current source transistor, a current flowing through the first current source transistor supplementing a current flowing from the output node through the NMOS transistor as function of PMOS current drive, the first current source transistor having a control terminal which is controlled independent of the intermediate voltage signal.

11. The buffer of claim 10, wherein changes in current provided by the first compensating current source are proportional to changes in current through the PMOS transistor.

12. A buffer circuit, comprising:

a differential amplifier stage for generating an intermediate voltage signal indicative of the voltage difference between a reference voltage signal and an input voltage signal applied to an input node of the differential amplifier stage;

an inverter stage for generating, on an output node, an output voltage signal based on the intermediate voltage signal, wherein the inverter stage comprises at least one PMOS transistor and at least one NMOS transistor; and at least a first current mirror circuit having a first branch and a second branch coupled to the output node, the second branch delivering a current to the output node, wherein current flowing through the first branch is dependent on changes in at least one of NMOS or PMOS current drive and current flowing through the second branch mirrors the current flowing through the first branch.

13. The buffer circuit of claim 12, wherein:

current flowing through the first branch of the first current mirror circuit varies with changes to the NMOS current drive; and current flowing from the second branch of the first current mirror circuit supplements current flowing into the output node through the PMOS transistor.

14. The buffer circuit of claim 12, wherein:

current flowing through the first branch of the first current mirror circuit varies with changes to the PMOS current drive; and current flowing into the second branch of the first current mirror circuit supplements current flowing from the output node through the NMOS transistor.

15. The buffer of claim 14, further comprising at least a second current mirror circuit having a first branch and a second branch coupled with the output node, wherein:

current flowing through the first branch of the second current mirror circuit varies with changes to NMOS current drive; and current flowing from the second branch of the second current mirror circuit supplements current flowing into the output node through the PMOS transistor.

16. The buffer circuit of claim 12, wherein the current flowing through the first branch of the first current mirror circuit is set by a process independent bias voltage supplied to a gate of a process dependent transistor.

17. The buffer circuit of claim 12, wherein the second branch of the first current mirror circuit comprises an NMOS transistor in parallel with the NMOS transistor of the inverter stage.

18. The buffer circuit of claim 12, wherein the second branch of the first current mirror circuit comprises a PMOS transistor in parallel with the PMOS transistor of the inverter stage.

19. The buffer circuit of claim 12, wherein a transistor of the second branch delivers current to the output node.

20. A memory device, comprising:

an input to receive an external clock signal; and a buffer circuit for generating an internal clock signal to be provided to one or more components of the memory device, wherein the buffer circuit comprises a first stage for generating an intermediate voltage signal indicative of a difference between a reference voltage signal and the clock signal, a second stage for generating an output voltage signal on an output node based on the intermediate voltage signal, an inverter for generating the internal clock signal based on the output voltage signal, and at least one compensating current source coupled to the output node to compensate for changes in at least one of a rate at which the output node is precharged and a rate at which the output node is discharged;

wherein the second stage comprises an inverter formed by a PMOS transistor and an NMOS transistor and wherein the at least one compensating current source comprises a first current source transistor to supplement current flowing into the output node through the PMOS transistor as function of NMOS current drive, the first current source transistor having a control terminal which is controlled independent of the intermediate voltage signal.

21. The memory device of claim 20, wherein the at least one compensating current source further comprises a second current source to supplement current flowing from the output node through the NMOS transistor as function of PMOS current drive.

22. The memory device of claim 20, wherein a current flows through the first current source transistor to supplement current flowing into the output node.

23. A memory device, comprising:
an input to receive an external clock signal; and
a buffer circuit for generating an internal clock signal to be provided to one or more components of the memory device, wherein the buffer circuit comprises a first stage for generating an intermediate voltage signal indicative of a difference between a reference voltage signal and the clock signal, a second stage for generating an output voltage signal on an output node based on the intermediate voltage signal, an inverter for generating the internal clock signal based on the output voltage signal, and at least one compensating current source coupled to the output node to compensate for changes in at least one of a rate at which the output node is precharged and a rate at which the output node is discharged;

wherein the second stage comprises an inverter formed by a PMOS transistor and an NMOS transistor and wherein the at least one compensating current source comprises a first current source transistor, a current flowing through the first current source transistor supplementing current flowing from the output node through the NMOS transistor as function of PMOS current drive, the first current source transistor having a control terminal which is controlled independent on the intermediate voltage signal.

24. A buffer circuit, comprising:
a differential amplifier stage for generating an intermediate voltage signal indicative of the voltage difference between a reference voltage signal and an input voltage signal applied to an input node of the differential amplifier stage;
an inverter stage for generating, on an output node, an output voltage signal based on the intermediate voltage signal, wherein the inverter stage comprises at least one PMOS transistor and at least one NMOS transistor;
at least a first current mirror circuit having a first branch and a second branch coupled to the output node, wherein:
current flowing through the first branch is dependent on changes in at least one of NMOS or PMOS current drive and current flowing through the second branch mirrors the current flowing through the first branch,
wherein current flowing through the first branch of the first current mirror circuit varies with changes to the PMOS current drive, and
wherein current flowing into the second branch of the first current mirror circuit supplements current flowing from the output node through the NMOS transistor; and
at least a second current mirror circuit having a first branch and a second branch coupled with the output node, wherein:
current flowing through the first branch of the second current mirror circuit varies with changes to NMOS current drive; and
current flowing from the second branch of the second current mirror circuit supplements current flowing into the output node through the PMOS transistor.

25. A buffer circuit, comprising:
a differential amplifier stage for generating an intermediate voltage signal indicative of the voltage difference between a reference voltage signal and an input voltage signal applied to an input node of the differential amplifier stage;
an inverter stage for generating, on an output node, an output voltage signal based on the intermediate voltage signal, wherein the inverter stage comprises at least one PMOS transistor and at least one NMOS transistor; and
at least a first current mirror circuit having a first branch and a second branch coupled to the output node,
wherein current flowing through the first branch is dependent on changes in at least one of NMOS or PMOS current drive and current flowing through the second branch mirrors the current flowing through the first branch, and
wherein the second branch of the first current mirror circuit comprises an NMOS transistor in parallel with the NMOS transistor of the inverter stage.

26. A buffer circuit, comprising:
a differential amplifier stage for generating an intermediate voltage signal indicative of the voltage difference between a reference voltage signal and an input voltage signal applied to an input node of the differential amplifier stage;
an inverter stage for generating, on an output node, an output voltage signal based on the intermediate voltage signal, wherein the inverter stage comprises at least one PMOS transistor and at least one NMOS transistor; and
at least a first current mirror circuit having a first branch and a second branch coupled to the output node,
wherein current flowing through the first branch is dependent on changes in at least one of NMOS or PMOS current drive and current flowing through the second branch mirrors the current flowing through the first branch,
wherein the second branch of the first current mirror circuit comprises a PMOS transistor in parallel with the PMOS transistor of the inverter stage.

* * * * *